US008310893B2

(12) United States Patent
Luthra et al.

(10) Patent No.: US 8,310,893 B2
(45) Date of Patent: Nov. 13, 2012

(54) TECHNIQUES FOR REDUCING IMPACT OF ARRAY DISTURBS IN A SEMICONDUCTOR MEMORY DEVICE

(75) Inventors: Yogesh Luthra, Chavannes-pres-Renens (CH); David Edward Fisch, Ecublens (CH)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 12/639,547

(22) Filed: Dec. 16, 2009

(65) Prior Publication Data
US 2011/0141836 A1 Jun. 16, 2011

(51) Int. Cl.
*G11C 7/00* (2006.01)
(52) U.S. Cl. ............. 365/222; 365/230.03; 365/189.07; 365/233.1
(58) Field of Classification Search .................. 365/222, 365/230.03, 189.07, 233.1
See application file for complete search history.

(56) References Cited

U.S. PATENT DOCUMENTS

| 3,439,214 A | 4/1969 | Kabell |
| 3,997,799 A | 12/1976 | Baker |
| 4,032,947 A | 6/1977 | Kesel et al. |
| 4,222,112 A * | 9/1980 | Clemons et al. ............. 365/203 |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |

(Continued)

FOREIGN PATENT DOCUMENTS
CA 272437 7/1927
(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

(Continued)

*Primary Examiner* — Viet Q Nguyen
(74) *Attorney, Agent, or Firm* — Wilmer Cutler Pickering Hale and Dorr LLP

(57) ABSTRACT

Techniques for reducing impact of array disturbs in a semiconductor memory device are disclosed. In one particular exemplary embodiment, the techniques may be realized as a method for reducing impact of array disturbs in a semiconductor memory device by increasing the refresh rate to the semiconductor memory device based at least in part on a frequency of active operations. The method may comprise receiving a first refresh command including a first subarray address to perform a first refresh operation to a first logical subarray of memory cells associated with the first subarray address. The method may also comprise receiving a second refresh command including a second subarray address to perform a second refresh operation to a second logical subarray of memory cells associated with the second subarray address, wherein the second refresh command is received after a time period from the reception of the first refresh command. The method may further comprise performing a number of concurrent refresh operations during the time period.

34 Claims, 5 Drawing Sheets

U.S. PATENT DOCUMENTS

| | | | |
|---|---|---|---|
| 5,164,805 | A | 11/1992 | Lee |
| 5,184,325 | A * | 2/1993 | Lipovski .................. 365/189.07 |
| 5,258,635 | A | 11/1993 | Nitayama et al. |
| 5,313,432 | A | 5/1994 | Lin et al. |
| 5,315,541 | A | 5/1994 | Harari et al. |
| 5,350,938 | A | 9/1994 | Matsukawa |
| 5,355,330 | A | 10/1994 | Hisamoto et al. |
| 5,388,068 | A | 2/1995 | Ghoshal et al. |
| 5,397,726 | A | 3/1995 | Bergemont et al. |
| 5,432,730 | A | 7/1995 | Shubat et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,506,436 | A | 4/1996 | Hayashi et al. |
| 5,515,383 | A | 5/1996 | Katoozi |
| 5,526,307 | A | 6/1996 | Yiu et al. |
| 5,528,062 | A | 6/1996 | Hsieh et al. |
| 5,568,356 | A | 10/1996 | Schwartz |
| 5,583,808 | A | 12/1996 | Brahmbhatt |
| 5,593,912 | A | 1/1997 | Rajeevakumar |
| 5,606,188 | A | 2/1997 | Bronner et al. |
| 5,608,250 | A | 3/1997 | Kalnitsky |
| 5,627,092 | A | 5/1997 | Alsmeier et al. |
| 5,631,186 | A | 5/1997 | Park et al. |
| 5,677,867 | A | 10/1997 | Hazani |
| 5,696,718 | A | 12/1997 | Hartmann |
| 5,724,295 | A * | 3/1998 | Beiley et al. .................. 365/222 |
| 5,740,099 | A | 4/1998 | Tanigawa |
| 5,754,469 | A | 5/1998 | Hung et al. |
| 5,774,411 | A | 6/1998 | Hsieh et al. |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,798,968 | A | 8/1998 | Lee et al. |
| 5,811,283 | A | 9/1998 | Sun |
| 5,847,411 | A | 12/1998 | Morii |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,926,429 | A * | 7/1999 | Saitoh et al. .................. 365/222 |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,968,840 | A | 10/1999 | Park et al. |
| 5,977,578 | A | 11/1999 | Tang |
| 5,982,003 | A | 11/1999 | Hu et al. |
| 5,986,914 | A | 11/1999 | McClure |
| 6,018,172 | A | 1/2000 | Hidada et al. |
| 6,048,756 | A | 4/2000 | Lee et al. |
| 6,081,443 | A | 6/2000 | Morishita |
| 6,096,598 | A | 8/2000 | Furukawa et al. |
| 6,097,056 | A | 8/2000 | Hsu et al. |
| 6,097,624 | A | 8/2000 | Chung et al. |
| 6,111,778 | A | 8/2000 | MacDonald et al. |
| 6,121,077 | A | 9/2000 | Hu et al. |
| 6,133,597 | A | 10/2000 | Li et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,698 | B1 | 1/2001 | Gruening et al. |
| 6,177,708 | B1 | 1/2001 | Kuang et al. |
| 6,195,303 | B1 * | 2/2001 | Zheng .................. 365/222 |
| 6,214,694 | B1 | 4/2001 | Leobandung et al. |
| 6,222,217 | B1 | 4/2001 | Kunikiyo |
| 6,225,158 | B1 | 5/2001 | Furukawa et al. |
| 6,233,193 | B1 * | 5/2001 | Holland et al. .................. 365/222 |
| 6,245,613 | B1 | 6/2001 | Hsu et al. |
| 6,252,281 | B1 | 6/2001 | Yamamoto et al. |
| 6,262,935 | B1 | 7/2001 | Parris et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,310,814 | B1 * | 10/2001 | Hampel et al. .................. 365/222 |
| 6,320,227 | B1 | 11/2001 | Lee et al. |
| 6,333,532 | B1 | 12/2001 | Davari et al. |
| 6,333,866 | B1 | 12/2001 | Ogata |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,432,769 | B1 | 8/2002 | Fukuda et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,479,862 | B1 | 11/2002 | King et al. |
| 6,480,407 | B1 | 11/2002 | Keeth |
| 6,492,211 | B1 | 12/2002 | Divakaruni et al. |
| 6,518,105 | B1 | 2/2003 | Yang et al. |
| 6,529,433 | B2 * | 3/2003 | Choi .................. 365/222 |
| 6,531,754 | B1 | 3/2003 | Nagano et al. |
| 6,537,871 | B2 | 3/2003 | Forbes |
| 6,538,916 | B2 | 3/2003 | Ohsawa |
| 6,544,837 | B1 | 4/2003 | Divakauni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,552,932 | B1 | 4/2003 | Cernea |
| 6,556,477 | B2 | 4/2003 | Hsu et al. |
| 6,560,142 | B1 | 5/2003 | Ando |
| 6,563,733 | B2 | 5/2003 | Chang et al. |
| 6,563,757 | B2 * | 5/2003 | Agata .................. 365/222 |
| 6,566,177 | B1 | 5/2003 | Radens et al. |
| 6,567,330 | B2 | 5/2003 | Fujita et al. |
| 6,573,566 | B2 | 6/2003 | Ker et al. |
| 6,574,135 | B1 | 6/2003 | Komatsuzaki |
| 6,590,258 | B2 | 7/2003 | Divakauni et al. |
| 6,590,259 | B2 | 7/2003 | Adkisson et al. |
| 6,617,651 | B2 | 9/2003 | Ohsawa |
| 6,621,725 | B2 | 9/2003 | Ohsawa |
| 6,632,723 | B2 | 10/2003 | Watanabe et al. |
| 6,650,565 | B1 | 11/2003 | Ohsawa |
| 6,653,175 | B1 | 11/2003 | Nemati et al. |
| 6,686,624 | B2 | 2/2004 | Hsu |
| 6,703,673 | B2 | 3/2004 | Houston |
| 6,707,118 | B2 | 3/2004 | Muljono et al. |
| 6,714,436 | B1 | 3/2004 | Burnett et al. |
| 6,721,222 | B2 | 4/2004 | Somasekhar et al. |
| 6,781,875 | B2 * | 8/2004 | Ohsawa .................. 365/174 |
| 6,825,524 | B1 | 11/2004 | Ikehashi et al. |
| 6,859,407 | B1 * | 2/2005 | Suh .................. 365/222 |
| 6,861,689 | B2 | 3/2005 | Burnett |
| 6,870,225 | B2 | 3/2005 | Bryant et al. |
| 6,882,566 | B2 | 4/2005 | Nejad et al. |
| 6,888,770 | B2 | 5/2005 | Ikehashi |
| 6,894,913 | B2 | 5/2005 | Yamauchi |
| 6,897,098 | B2 | 5/2005 | Hareland et al. |
| 6,903,984 | B1 | 6/2005 | Tang et al. |
| 6,909,151 | B2 | 6/2005 | Hareland et al. |
| 6,912,150 | B2 | 6/2005 | Portman et al. |
| 6,913,964 | B2 | 7/2005 | Hsu |
| 6,914,841 | B1 * | 7/2005 | Thwaite .................. 365/222 |
| 6,936,508 | B2 | 8/2005 | Visokay et al. |
| 6,967,885 | B2 * | 11/2005 | Barth et al. .................. 365/222 |
| 6,969,662 | B2 | 11/2005 | Fazan et al. |
| 6,975,536 | B2 | 12/2005 | Maayan et al. |
| 6,982,902 | B2 | 1/2006 | Gogl et al. |
| 6,987,041 | B2 | 1/2006 | Ohkawa |
| 7,030,436 | B2 | 4/2006 | Forbes |
| 7,037,790 | B2 | 5/2006 | Chang et al. |
| 7,041,538 | B2 | 5/2006 | Ieong et al. |
| 7,042,765 | B2 | 5/2006 | Sibigtroth et al. |
| 7,061,806 | B2 | 6/2006 | Tang et al. |
| 7,085,153 | B2 | 8/2006 | Ferrant et al. |
| 7,085,156 | B2 | 8/2006 | Ferrant et al. |

| | | |
|---|---|---|
| 7,088,633 B2* | 8/2006 | Remaklus et al. ............ 365/222 |
| 7,145,825 B2* | 12/2006 | Mori et al. ................... 365/222 |
| 7,170,807 B2 | 1/2007 | Fazan et al. |
| 7,177,175 B2 | 2/2007 | Fazan et al. |
| 7,184,350 B2* | 2/2007 | Remaklus et al. ............ 365/222 |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,263,021 B2* | 8/2007 | Lee .............................. 365/222 |
| 7,301,803 B2 | 11/2007 | Okhonin et al. |
| 7,301,838 B2 | 11/2007 | Waller |
| 7,313,047 B2 | 12/2007 | Kim |
| 7,317,641 B2 | 1/2008 | Scheuerlein |
| 7,324,387 B1 | 1/2008 | Bergemont et al. |
| 7,330,391 B2* | 2/2008 | Freebern ...................... 365/222 |
| 7,335,934 B2 | 2/2008 | Fazan |
| 7,341,904 B2 | 3/2008 | Willer |
| 7,362,643 B2* | 4/2008 | Okada ........................... 365/222 |
| 7,379,367 B2* | 5/2008 | Kim .............................. 365/222 |
| 7,416,943 B2 | 8/2008 | Figura et al. |
| 7,444,577 B2* | 10/2008 | Best et al. ..................... 714/745 |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,630,268 B2* | 12/2009 | Eto ............................... 365/222 |
| 7,696,032 B2 | 4/2010 | Kim et al. |
| 7,734,866 B2* | 6/2010 | Tsern ........................... 711/106 |
| 7,755,967 B2* | 7/2010 | Kunce et al. ................. 365/222 |
| 7,911,866 B2* | 3/2011 | Kobayashi .................... 365/222 |
| 8,151,044 B2* | 4/2012 | Proesbsting .................. 711/107 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |

| | | |
|---|---|---|
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0211549 A1 | 9/2007 | Kobayashi |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |

| | | |
|---|---|---|
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| JP | 2005-332497 | 12/2005 |
| JP | 2007-035151 | 2/2007 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.

Arimoto, A High-Density Scalable Twin Transistor Ram (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T DRAM on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., Spice Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008; IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, 2008, IEEE Trans. On El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMòDevices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by The Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitorless DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less DRAM Memory, SOI Conference, 2009 IEEE International, Oct. 5-8, 2009 pp. 1-2.

Roy, Thyristor-Based Volatile Memory in Nano-Scale CMOS, 2006, ISSCC.

Sailing et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shimo, Fully-Depleted FBC (Floating Body Cell) with Enlarged Signal Window and Excellent Logic Process Compatibility, 2004, IEDM.

Shino, Highly Scalable FBC (Floating Body Cell) with 25nm Box Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICCSSDM, Sendai, 2009, pp. 144-145.

Terauchi et al., "Analysis of Floating-Body-Induced Leakage Current in 0.15µm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INNFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed. Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

International Search Report and Written Opinion mailed on Aug. 11, 2011, for International application No. PCT/US2010/060543 filed Dec. 15, 2010 (8 pages).

\* cited by examiner

TECHNIQUES FOR REDUCING IMPACT OF ARRAY DISTURBS IN A SEMICONDUCTOR MEMORY DEVICE

FIELD OF THE DISCLOSURE

The present disclosure relates generally to semiconductor memory devices and, more particularly, to techniques for reducing impact of array disturbs in a semiconductor memory device.

BACKGROUND OF THE DISCLOSURE

There is a continuing trend to employ and/or fabricate advanced integrated circuits using techniques, materials, and devices that improve performance, reduce leakage current, and enhance overall scaling. Semiconductor-on-insulator (SOI) is a material which may be used to fabricate such integrated circuits. Such integrated circuits are known as SOI devices and may include, for example, partially depleted (PD) devices, fully depleted (FD) devices, multiple gate devices (for example, double or triple gate), and Fin-FET devices.

A semiconductor memory device may include an electrically floating body in which electrical charges may be stored. Also, a semiconductor memory device may store charges in a discrete capacitor. The electrical charges stored in the electrically floating body or in a discrete capacitor may represent a logic high or binary "1" data state or a logic low or binary "0" data state. Also, a semiconductor memory device may be fabricated with semiconductor-on-insulator (SOI) substrates, bulk substrates (e.g., enabling body isolation), local semiconductor-on-insulator (SOI), and/or 3-D devices. For example, a semiconductor memory device may be fabricated with 3-D devices (e.g., multiple gate devices, Fin-FETs, recessed gates and pillars).

In one conventional technique, a memory cell of a semiconductor memory device having one or more memory transistors may be read by applying a bias to a drain region of a memory transistor, as well as a bias to a gate of the memory transistor that is above a threshold voltage of the memory transistor. As such, conventional reading techniques sense an amount of channel current provided/generated in response to the application of the bias to the gate of the memory transistor to determine a state of the memory cell. For example, an electrically floating body region of the memory cell may have two or more different current states corresponding to two or more different logical states (e.g., two different current conditions/states corresponding to two different logic states: binary "0" data state and binary "1" data state).

Also, conventional writing techniques for memory cells having an N-Channel type memory transistor typically result in an excess of majority charge carriers by channel impact ionization, by band-to-band tunneling (gate-induced drain leakage "GIDL"), or direct injection. The majority charge carriers may be removed via drain side hole removal, source side hole removal, or drain and source hole removal, for example, using back gate pulsing.

Often, conventional reading and/or writing techniques may lead to relatively large power consumption and large voltage swings which may cause disturbance to memory cells on unselected rows in the memory device. Also, pulsing between positive and negative gate biases during read and write operations may reduce a net quantity of charge carriers in a body region of a memory cell in the memory device, which, in turn, may gradually eliminate data stored in the memory cell. In the event that a negative voltage is applied to a gate of a memory cell transistor, thereby causing a negative gate bias, a channel of minority charge carriers beneath the gate may be eliminated. However, some of the minority charge carriers may remain "trapped" in interface defects. Some of the trapped minority charge carriers may recombine with majority charge carriers, which may be attracted to the gate, and the net charge in majority charge carriers located in the floating body region may decrease over time. This phenomenon may be characterized as charge pumping, which is a problem because the net quantity of charge carriers may be reduced in the memory cell, which, in turn, may gradually eliminate data stored in the memory cell.

Additionally, conventional reading and/or writing techniques may lead to disturbance (e.g., influence a data state stored in a memory cell) in one or more unselected memory cells. For example, a plurality of memory cells may be coupled to a common source line (SL). Although, a single memory cell may be selected for a read and/or a write operations, all memory cells coupled to the source line (SL) may receive a voltage applied to the source line (SL). Therefore, one or more unselected memory cells coupled to the source line (SL) may be disturbed (e.g., influence an amount of charged stored in the memory cells) by a voltage applied to the source line (SL).

In another conventional reading and writing technique, a plurality of data storage capacitors may be isolated from a common bit line (BL) by one or more corresponding access transistors controlled by word lines (WL). For the conventional read and write operations, word line (WL) to word line (WL) coupling and fluctuation in the bit line voltage may increase a rate of charge loss for unselected data storage capacitors.

In view of the foregoing, it may be understood that there may be significant problems and shortcomings associated with conventional techniques for reading from and/or writing to semiconductor memory devices.

SUMMARY OF THE DISCLOSURE

Techniques for reducing impact of array disturbs in a semiconductor memory device are disclosed. In one particular exemplary embodiment, the techniques may be realized as a method for reducing impact of array disturbs in a semiconductor memory device by increasing the refresh rate to the semiconductor memory device based at least in part on a frequency of active operations. The method may comprise receiving a first refresh command including a first subarray address to perform a first refresh operation to a first logical subarray of memory cells associated with the first subarray address. The method may also comprise receiving a second refresh command including a second subarray address to perform a second refresh operation to a second logical subarray of memory cells associated with the second subarray address, wherein the second refresh command is received after a time period from the reception of the first refresh command. The method may further comprise performing a number of concurrent refresh operations during the time period.

In accordance with other aspects of this particular exemplary embodiment, the number of concurrent refresh operations may be based at least in part on a number of active operations including an active subarray address performed during the time period, wherein the active operations may access one or more subarray addresses.

In accordance with further aspects of this particular exemplary embodiment, the number of concurrent refresh operations performed may be based at least in part on a number of plurality of subarrays within a plurality of banks of memory cells.

In accordance with additional aspects of this particular exemplary embodiment, in the event that the active subarray address of the active operation is equal to a refresh subarray address of a first concurrent refresh operation, the refresh subarray address may be stored in a clash buffer.

In accordance with other aspects of this particular exemplary embodiment, wherein the refresh subarray address stored in the clash buffer may be used for a second concurrent refresh operation, wherein the first concurrent refresh operation may be performed to a different subarray address than the second concurrent refresh operation.

In accordance with further aspects of this particular exemplary embodiment, the method may further comprise clearing the clash buffer when the second concurrent refresh operation may be performed to the refresh subarray address stored in the clash buffer.

In accordance with additional aspects of this particular exemplary embodiment, the method may further comprise clearing the clash buffer upon completion of at least one of the first refresh operation and the second refresh operation to a subarray address stored in the clash buffer.

In accordance with yet another aspect of this particular exemplary embodiment, the refresh subarray address stored in the clash buffer may be used for the second subarray address for the second refresh operation.

In accordance with other aspects of this particular exemplary embodiment, the concurrent refresh operations may be performed to a subarray address stored in a concurrent refresh subarray counter and latch.

In another particular exemplary embodiment, the techniques may be realized as a method for increase a refresh rate for a semiconductor memory device receiving one or more refresh commands by performing concurrent refresh operations in parallel to one or more active operations. The method may comprise receiving a first refresh command including a first subarray address to perform a first refresh operation to a first logical subarray of memory cells associated with the first subarray address. The method may also comprise receiving a second refresh command including a second subarray address to perform a second refresh operation to a second logical subarray of memory cells associated with the second subarray address, wherein the second refresh command is received after a time period from the reception of the first refresh command. The method may further comprise performing a number of concurrent refresh operations during the time period.

In accordance with other aspects of this particular exemplary embodiment, the number of concurrent refresh operations may be based at least in part on a number of active operations including an active subarray address performed during the time period, wherein the active operations may access one or more subarray addresses.

In accordance with further aspects of this particular exemplary embodiment, the number of concurrent refresh operations performed may be based at least in part on a number of plurality of subarrays within a plurality of banks of memory cells.

In accordance with additional aspects of this particular exemplary embodiment, in the event that the active subarray address of the active operation is equal to a refresh subarray address of a first concurrent refresh operation, the refresh subarray address may be stored in a clash buffer.

In accordance with yet another aspect of this particular exemplary embodiment, the refresh subarray address stored in the clash buffer may be used for a second concurrent refresh operation, wherein the first concurrent refresh operation may be performed to a different subarray address than the second concurrent refresh operation.

In accordance with other aspect of this particular exemplary embodiment, the method may further comprise clearing the clash buffer when the second concurrent refresh operation may be performed to the refresh subarray address stored in the clash buffer.

In accordance with further aspects of this particular exemplary embodiment, the method may further comprise clearing the clash buffer upon completion of at least one of the first refresh operation and the second refresh operation.

In accordance with additional aspects of this particular exemplary embodiment, the refresh subarray address stored in the clash buffer may be used for the second subarray address for the second refresh operation.

In accordance with yet another aspect of this particular exemplary embodiment, the concurrent refresh operations may be performed to a subarray address stored in a concurrent refresh subarray counter and latch.

In another particular exemplary embodiment, the techniques may be realized as a system for reducing impact of array disturbs in a semiconductor memory device. The semiconductor memory device may comprise means for receiving a first active command directed to an active subarray address to perform a number of active operations to the active subarray address. The semiconductor memory device may also comprise means for performing a number of concurrent refresh operations between two consecutive refresh operations to one or more inactive subarray addresses, wherein the number of concurrent refresh operations may be based at least in part on the number of active operations performed between the two consecutive refresh operations.

In another particular exemplary embodiment, the techniques may be realized as a semiconductor memory device for reducing impact of array disturbs. The semiconductor memory device may comprise a memory cell array having one or more banks of memory cells arranged in arrays of rows and columns, wherein each of the one or more banks of memory cells may include a plurality of subarrays of memory cells. The semiconductor memory device may also comprise a plurality of concurrent refresh controllers coupled to the one or more banks of memory cells configured to provide one or more concurrent refresh control signals to the one or more banks of memory cells in order to perform one or more concurrent refresh operations.

In accordance with other aspects of this particular exemplary embodiment, the semiconductor memory device may further comprise one or more row address latch and decoders configured to provide the one or more concurrent refresh control signals from the plurality of concurrent refresh controllers to the one or more banks of memory cells.

In accordance with further aspects of this particular exemplary embodiment, each of the plurality of concurrent refresh controllers may be configured to generate a multiplexer control signal that may enable or disable a corresponding row address latch and decoder.

In accordance with additional aspects of this particular exemplary embodiment, each of the plurality of concurrent refresh controllers may comprise a refresh row counter.

In accordance with yet another aspect of this particular exemplary embodiment, the refresh row counter may store row address information associated with the plurality of subarrays of a corresponding one of the one or more banks of memory cells.

In accordance with other aspects of this particular exemplary embodiment, each of the plurality of concurrent refresh controllers may further comprise a concurrent refresh subarray counter and latch.

In accordance with further aspects of this particular exemplary embodiment, the concurrent refresh subarray counter and latch may store subarray address information associated with a corresponding one of the one or more banks of memory cells.

In accordance with additional aspects of this particular exemplary embodiment, each concurrent refresh subarray counter and latch may increment or toggle to a next subarray address with each execution of an active command.

In accordance with yet another aspect of this particular exemplary embodiment, after each concurrent refresh subarray counter and latch may increment or toggle through all of the plurality of subarrays of a corresponding one of the one or more banks of memory cells, a corresponding refresh row counter may increment or toggle to a next row address.

In accordance with other aspects of this particular exemplary embodiment, each of the plurality of concurrent refresh controllers may further comprise a clash buffer.

In accordance with further aspects of this particular exemplary embodiment, the clash buffer may store subarray address information in the event of a clash condition.

In accordance with additional aspects of this particular exemplary embodiment, the clash condition may occur in the event that subarray address information of one or more active commands may equal subarray address information stored in a corresponding concurrent refresh subarray counter and latch or the subarray address information of the one or more active commands may equal subarray address information stored in a corresponding clash buffer.

In accordance with yet another aspect of this particular exemplary embodiment, in the event of the clash condition, a clash buffer may be set to a subarray address stored in a corresponding concurrent refresh subarray counter and latch.

In accordance with other aspects of this particular exemplary embodiment, the semiconductor memory device may further comprise a command decoder.

In accordance with further aspects of this particular exemplary embodiment, the command decoder may be configured to provide one or more active commands to the one or more banks of memory cells in order to perform one or more operations.

In accordance with additional aspects of this particular exemplary embodiment, the one or more operations may include at least one of a read operation, a write operation, a precharge operation, and a refresh command.

In accordance with yet another aspect of this particular exemplary embodiment, the semiconductor memory device may further comprise a normal refresh controller.

In accordance with other aspects of this particular exemplary embodiment, the normal refresh controller may be configured to provide one or more refresh control signals to the plurality of concurrent refresh controllers.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

There are many embodiments described and illustrated herein. In one aspect, the present disclosure is directed to a combination of disturbance mitigation schemes which allow refresh and/or recovery of data states stored in a memory cell of a semiconductor memory device, thereby and reducing disturbance to surrounding memory cells. For example, the present disclosure is directed to a scheme that may reduce loss associated with one or more unselected memory cells in an active memory cell array by increasing a rate of refreshing the active memory cell array. Further, the present disclosure is directed to a scheme that may increase refresh rate based on array activity without an increase in power consumption.

Figure 1:
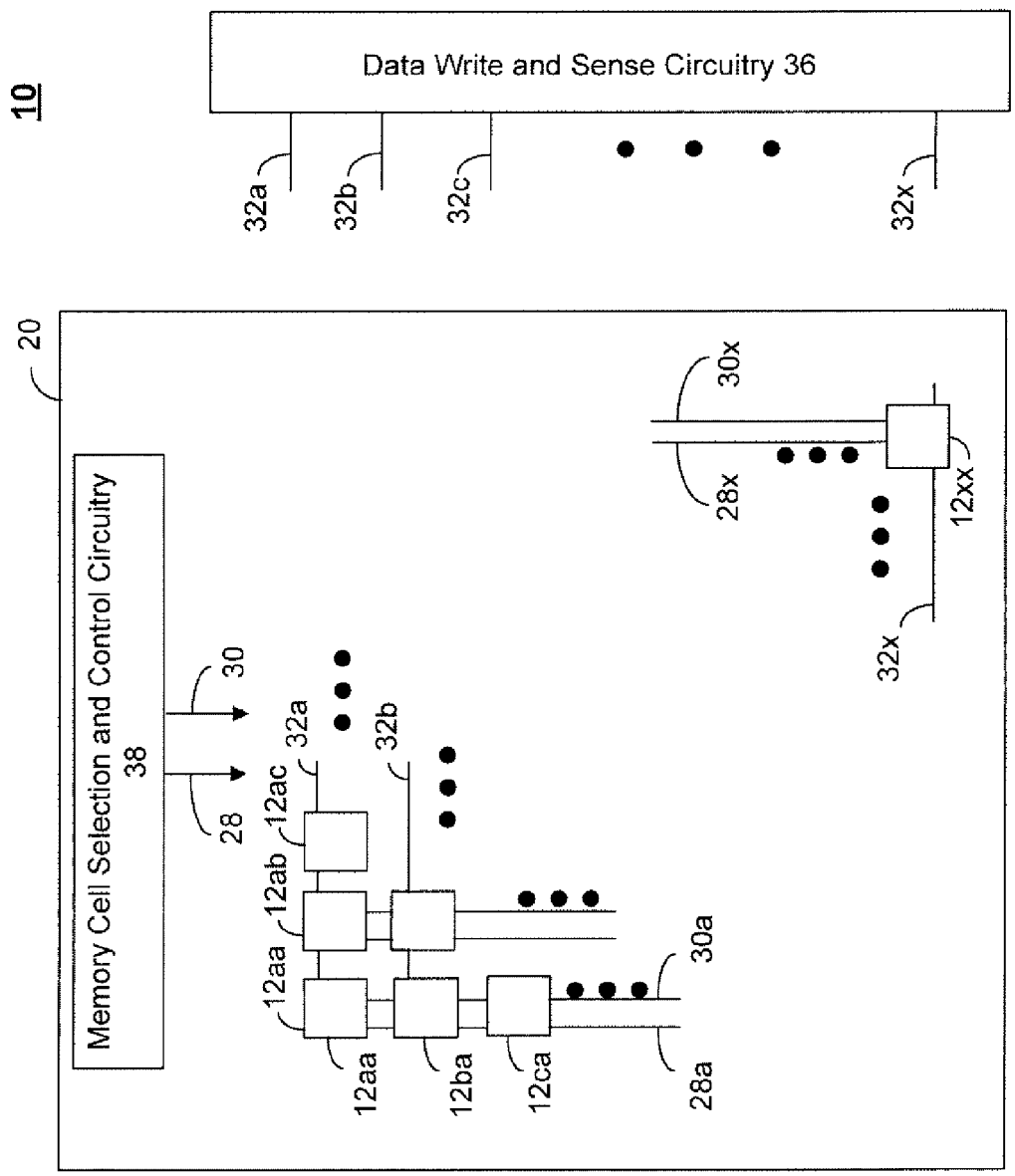
FIG. 1 shows a schematic block diagram of a semiconductor memory device including a memory cell array, data write and sense circuitry, and memory cell selection and control circuitry in accordance with an embodiment of the present disclosure.

Referring to FIG. 1, there is shown a schematic block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a source line (SL) 30 and a word line (WL) 28, and the data write and sense circuitry 36 via a bit line (BL) 32. The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (BL) 32 and a current or voltage reference signal. For example, each data sense amplifier may be a cross-coupled type sense amplifier to sense a data state stored in a memory cell 12.

Each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 contains a logic high (binary "1" data state) or a logic low (binary "0" data state). It may be appreciated by one having ordinary skill in the art that any type or form of data write and sense circuitry 36 (including one or more sense amplifiers, using voltage or current sensing techniques, to sense a data state stored in a memory cell 12) to read data stored in memory cells 12 and/or write data to memory cells 12 may be employed.

Also, the memory cell selection and control circuitry 38 may select and/or enable one or more predetermined memory cells 12 to facilitate reading data therefrom and/or writing data thereto by applying control signals on one or more word lines (WL) 28 and/or source lines (SL) 30. The memory cell selection and control circuitry 38 may generate such control signals using address data, for example, row address data. Moreover, the memory cell selection and control circuitry 38 may include a word line decoder and/or driver. For example, the memory cell selection and control circuitry 38 may include one or more different control/selection techniques (and circuitry therefor) to select and/or enable one or more predetermined memory cells 12. Such techniques, and circuitry therefor, should be well known to those skilled in the art. Notably, all such control/selection techniques, and circuitry therefor, whether now known or later developed, are intended to fall within the scope of the present disclosure.

In an exemplary embodiment, the semiconductor memory device 10 may implement a two step write operation whereby all the memory cells 12 in a row of memory cells 12 are first written to a predetermined data state by first executing a "clear" operation, whereby all of the memory cells 12 in the row of memory cells 12 are written to logic low (binary "0" data state). Thereafter, selected memory cells 12 in the row of memory cells 12 are selectively written to the predetermined data state (e.g., a logic high (binary "1" data state)). The semiconductor memory device 10 may also implement a one step write operation whereby selective memory cells 12 in a row of memory cells 12 are selectively written to either a logic high (binary "1" data state) or a logic low (binary "0" data state) without first implementing a "clear" operation. The semiconductor memory device 10 may employ any of the exemplary writing, holding, and/or reading techniques described herein.

The memory cells 12 may comprise N-channel, P-channel and/or both types of transistors. Indeed, circuitry that is peripheral to the memory array 20 (for example, sense amplifiers or comparators, row and column address decoders, as well as line drivers (not illustrated herein)) may include P-channel and/or N-channel type transistors. Where P-channel type transistors are employed in memory cells 12 in the memory array 20, suitable write and read voltages (for example, negative voltages or opposite polarities to voltages used for an N-channel device) should be well known to those skilled in the art in light of this disclosure. Accordingly, for sake of brevity, a discussion of such suitable voltages will not be included herein.

Figure 2:
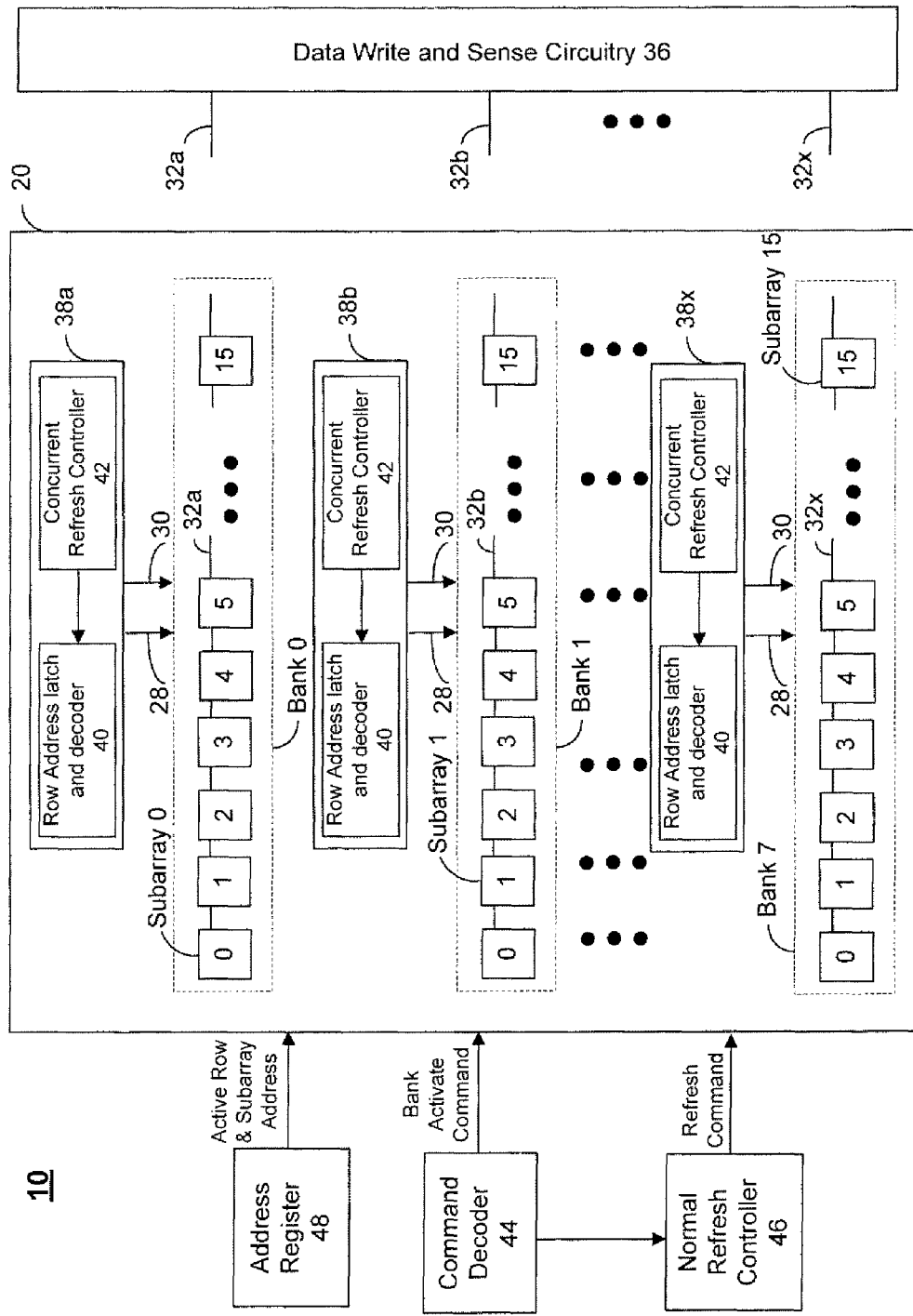
FIG. 2 shows a detailed schematic block diagram of a semiconductor memory device including a memory cell array, data write and sense circuitry, and memory cell selection and control circuitry in accordance with an embodiment of the present disclosure.

Referring to FIG. 2, there is shown a more detailed schematic block diagram of the semiconductor memory device 10 comprising the memory cell array 20, the data write and sense circuitry 36, and the memory cell selection and control circuitry 38 in accordance with an embodiment of the present disclosure. As described above in FIG. 1, the semiconductor memory device 10 may include the memory cell array 20 comprising the plurality of memory cells 12 each coupled to one or more memory cell selection and control circuitry 38(a-x) via a source line (SL) 30 and a word line (WL) 28, and the data write and sense circuitry 36 via a bit line (EL) 32. The data write and sense circuitry 36 may read data from and may write data to selected memory cells 12. The memory cell selection and control circuitry 38 may generate control signals on one or more word lines (WL) 28 and/or source lines (SL) 30. A command decoder 44, a normal refresh controller 46, and/or an address register 48 may apply one or more control signals to the memory cell array 20 and/or the memory cell selection and control circuitry 38.

The memory cells 12 of the memory cell array 20 may be arranged into one or more individual banks of memory cells 12. Each individual bank of memory cells 12 may be activated independently via the corresponding memory cell selection and control circuitry 38(a-x). The number of banks of memory cells 12 may vary depending on the size of the memory cell array 20. Also, a number of memory cell selection and control circuitry 38(a-x) may correspond to a number of banks of memory cells 12 within the memory cell array 20. For example, a smaller memory cell array 20 may have fewer banks of memory cells 12 than a larger memory cell array 20. In an exemplary embodiment, the memory cell array 20 may be arranged into 8 banks (e.g., bank 0-bank 7) of memory cells 12. Also, each of the 8 banks of memory cells 12 may be independently activated via a corresponding memory cell selection and control circuitry 38(a-h). Each bank of memory cells 12 may include one or more logical subarrays of memory cells 12. For example, each logical subarray of memory cells 12 may include one or more individual physical subarrays of memory cells 12 that may share the same row address. The number of logical subarrays of memory cells 12 in a bank may vary depending on the architecture of the memory cell array 20 and/or physical size of the logical subarray of memory cells 12. In an exemplary embodiment, each individual bank of memory cells 12 may include 16 logical subarrays (e.g., subarray 0-subarray 15).

The memory cell selection and control circuitry 38 may include one or more row address latch and decoder 40 and one or more concurrent refresh controller 42. Each row address latch and decoder 40 may receive a signal to access a row of subarray of a bank in the memory cell array 20. In an exemplary embodiment, each row address latch and decoder 40 may receive the signal simultaneously with another row address latch and decoder 40 so as to access a row of a subarray of a plurality of banks in the memory cell array 20. Each row address latch and decoder 40 may be coupled to the memory cell array 20 via one or more word line (WL) 28 and/or source lines (SL) 30. In an exemplary embodiment, a row address latch and decoder 40 may be provided for each bank of the memory cell array 20 in order to access and/or control each bank of the memory cell array 20 independently.

Each concurrent refresh controller 42 may receive one or more control signals from the command decoder 44 and/or normal refresh controller 46. Each concurrent refresh controller 42 may receive the control signals from the command decoder 44 and/or the normal refresh controller 46 and provide the control signals to the memory cell array 20 via a corresponding row address latch and decoder 40, word line (WL) 28, and source line (SL) 30. Each concurrent refresh controller 42 may enable or disable a corresponding row address latch and decoder 40.

In an exemplary embodiment, each row address latch and decoder 40 may provide a row address control signal to the memory cell array 20. Each concurrent refresh controller 42 may generate a multiplexer control signal that may enable or disable the row address control signal provided by a corresponding row address latch and decoder 40 to the memory cell array 20. The number of concurrent refresh controllers 42 within the memory cell selection and control circuitry 38 may be dependent on the number of banks within the memory cell array 20. In an exemplary embodiment, a concurrent refresh controller 42 may be associated with a single bank within the memory cell array 20. Thus, the number of concurrent refresh controllers 42 within the memory cell selection and control circuitry 38 may be the same as the number of banks within the memory cell array 20. Each bank within the memory cell array 20 may be accessed and/or refreshed independently and/or concurrently under the control of a corresponding concurrent refresh controller 42.

In another exemplary embodiment, each concurrent refresh controller 42 may receive one or more refresh control signals from the command decoder 44 and/or the normal refresh controller 46. The one or more refresh control signals from the command decoder 44 and/or the normal refresh controller 46 may include a refresh timer signal, a decoded command, and/or timing controls associated with one or more refresh operations. Each concurrent refresh controller 42 may receive the one or more refresh control signals and determine whether to perform one or more refresh operations, as will be discussed in further detail below.

The command decoder 44 may receive one or more clock and/or control signals in order to provide one or more bank activated commands. For example, the command decoder 44 may receive a plurality of clock and/or control signals in order to generate one or more bank activate commands. The command decoder 44 may receive a plurality of clock and/or control signals in order to generate a read command, a write command, a precharge command, a refresh command, and/or other commands to be performed on a bank of the memory cell array 20. For example, a refresh command may be an operation having a predetermined time period to refresh data states (e.g., a logic high (binary "1" data state) or a logic low (binary "0" data state)) stored a set of logical subarray of memory cells 12. In another exemplary embodiment, the command decoder 44 may generate one or more refresh control signals. In other exemplary embodiments, the command decoders may receive one or more refresh control signals and may provide the one or more refresh control signals to the normal refresh controller 46 in order to facilitate one or more refresh operations.

The normal refresh controller 46 may supply one or more refresh control signals to the memory cell array 20 via the row address latches and decoders 40 and/or the concurrent refresh controllers 42. The normal refresh controller 46 may generate the one or more refresh control signals or receive the one or more refresh control signals from the command decoder 44. In an exemplary embodiment, the normal refresh controller 46 may provide one or more refresh control signals to refresh one row of the memory cell array 20. For example, during a refresh command, the normal refresh controller 46 may provide the one or more refresh control signals having a row address to the row address latches and decoders 40, and the one or more memory cells 12 having the row address in the memory cell array 20 may be refreshed accordingly.

The normal refresh controller 46 may determine an interval between refresh commands. For example, the interval between refresh commands (e.g., a refresh cycle) associated with the normal refresh controller 46 may vary. However, in an exemplary embodiment, the interval between refresh commands associated with the normal refresh controller 46 may be approximately 7.8 microseconds. For example, the interval between refresh commands may be generated externally by a memory controller (not shown) or internally by the normal refresh controller 46.

The address register 48 may be coupled to the row address latches and decoders 40 and/or the concurrent refresh controllers 42. The address register 48 may receive one or more operation control signals having a row address and/or a subarray address and decode the one or more operation control signals to provide the row address and/or the subarray address to a bank of the memory cell array 20 to facilitate one or more operations. Also, the address register 48 may provide a row address and/or a subarray address of a bank within the memory cell array 20 to the row address latches and decoders 40 and/or the concurrent refresh controllers 42 to facilitate one or more operations.

Figure 3:
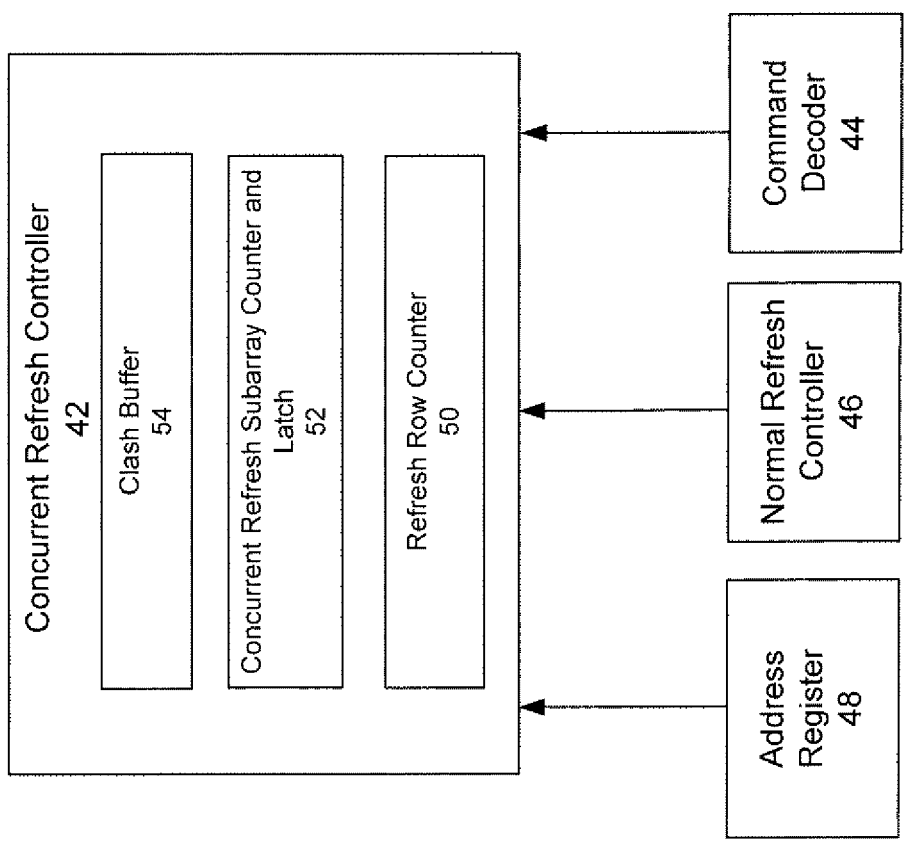
FIG. 3 shows a schematic block diagram of a concurrent refresh controller of a data write and sense circuit and related circuitry for a semiconductor memory device in accordance with an embodiment of the present disclosure.

Referring to FIG. 3, there is shown a detailed schematic block diagram of a concurrent refresh controller 42 of the memory cell selection and control circuitry 38 for the semiconductor memory device 10 in accordance with an embodiment of the present disclosure. As shown in FIG. 3, the concurrent refresh controller 42 may be coupled to the command decoder 44, the normal refresh controller 46 and/or the address register 48. The concurrent refresh controller 42 may include a refresh row counter 50, a concurrent refresh subarray counter and latch 52, and/or a clash buffer 54. The concurrent refresh controller 42 may control a refresh operation of the memory cell array 20. The concurrent refresh controller 42 may control one or more refresh operations when one or more refresh control signals are received from the normal refresh controller 46 or when one or more activate commands are received from the command decoder 44 and sent to the concurrent refresh controller 42. In an exemplary embodiment, the concurrent refresh subarray counter and latch 52 may contain subarray address for a concurrent refresh operation. The concurrent refresh operation may be triggered by an active command received from the command decoder 44. The clash buffer 54 may contain subarray address of concurrent refresh operation that may be previously blocked because of a conflict between the concurrent refresh subarray counter and latch 52 and the address register 48 (e.g., subarray address stored in the concurrent refresh subarray counter and latch 52 may equal the subarray address in the address register 48). Upon reception of an active command, a refresh operation may be performed concurrently to the subarray address stored in the clash buffer 54 in the event that the subarray address stored in the clash buffer 54 does not equal to the subarray address associated with the active command. In the event that that a concurrent refresh operation is performed to the subarray address stored in the clash buffer 54, the clash buffer 54 may clear or reset the subarray address stored therein. For example, the address register 48 may provide a row address and/or a subarray address of a bank within the memory cell array 20 to the concurrent refresh controllers 42. In the event that the clash buffer 54 is in a default or cleared state and the subarray address associated with an active command does not equal to the subarray address stored in the concurrent refresh subarray counter and latch 52, a refresh operation may be performed concurrently to the subarray address stored in the concurrent refresh subarray counter and latch 52. In the event that a concurrent refresh operation is performed to the subarray address stored in the concurrent refresh subarray counter and latch 52, the concurrent refresh subarray counter and latch 52 may increment the subarray address stored therein.

In other exemplary embodiments, in the event of a clash condition (e.g., the subarray address in the clash buffer 54 is equal to the subarray address in the one or more active commands), the concurrent refresh controller 42 may perform a concurrent refresh operation to the subarray address in the concurrent refresh subarray counter and latch 52. Also, a clash condition may occur in the event that the class buffer 54 is empty and the subarray address in the concurrent refresh subarray counter and latch 52 is equal to the subarray address in the one or more active commands, the subarray address in the concurrent refresh subarray counter and latch 52 may be stored in the clash buffer 54. Simultaneously or subsequently, the concurrent refresh subarray counter and latch 52 may be incremented to the next subarray address and a concurrent refresh operation may be performed to the next subarray address in the concurrent refresh subarray counter and latch 52. In an exemplary embodiment, the concurrent refresh subarray counter and latch 52 may be reset or cleared, in the event that a concurrent refresh operation is performed to all subarrays within a bank of memory cells 12. In the event that the concurrent refresh subarray counter and latch 52 may be cleared or reset, concurrent refresh operation may not be performed until a normal refresh command is received.

In an exemplary embodiment, the concurrent refresh controller 42 may increase a refresh rate in the event that one or more operations (e.g., a read operation, a write operation, a precharge operation, and/or a refresh operation) may be performed on one or more banks of the memory cell array 20. The concurrent refresh controller 42 may increase the refresh rate by 8 times, 16 times, 32 times, 64 times, and so on for one or more operations performed on the one or more banks of the memory cell array 20. For example, the concurrent refresh controller 42 may increase the refresh rate by 16 times in the event that one or more operations may be performed on a bank of the memory cell array 20. The concurrent refresh controller 42 may increase the refresh rate by introducing concurrent refresh operations between consecutive refresh commands. For example, the concurrent refresh controller 42 may refresh a bank of the memory cell array 20 every 4 milliseconds instead of every 64 milliseconds.

In an exemplary embodiment, the concurrent refresh controller 42 may increase the refresh rate based at least in part on a number of operations performed on a bank of the memory cell array 20 between refresh commands initiated by the normal refresh controller 46. For example, in the event that a bank of the memory cell array 20 may include 16 subarrays, the concurrent refresh controller 42 may increase the refresh rate by 16 times compared to a refresh rate initiated by the normal refresh controller 46 in an implementation where the concurrent refresh subarray counter and latch 52 may be reset or cleared after 16 concurrent refresh commands. Also, the refresh rate may increase or decrease based on an increase or decrease of the number of subarrays in a bank within the memory cell array 20. For example, a bank within the memory cell array 20 may include 8 subarrays and the concurrent refresh controller 42 may increase the refresh rate by 8 times in an implementation where the concurrent refresh subarray counter and latch 52 may be reset or cleared after 8 concurrent refresh operations. In another exemplary embodiment, the concurrent refresh subarray counter and latch 52 may not reset after each subarray may have concurrently refreshed between normal refresh operations. By not resetting the concurrent refresh subarray counter and latch 52, the refresh rate may be associated with one or more active commands (e.g., precharge commands) received from the command decoder 44. Also, a bank within the memory cell array 20 may include 32 subarrays and the concurrent refresh controller 42 may increase the refresh rate by a maximum of 32 times during a refresh cycle for each time the concurrent refresh subarray counter and latch 52 may complete 32 concurrent refresh commands. For example, a refresh cycle may be a time period between two consecutive refresh commands during which one or more concurrent refresh operations and/or active operations (e.g., a read operation, a write operation, and/or a precharge operation) occur.

For example, in the event that 2 operations may be performed during a refresh command, the concurrent refresh controller 42 may increase the refresh rate by 2 times and perform 2 refresh operations at the refresh command. Also, in the event that 4 operations may be performed during a refresh command, the concurrent refresh controller 42 may increase the refresh rate by 4 times and perform 4 refresh operations at the refresh command. Also, in the event that 2 refresh operations are performed during an active command, the concurrent refresh rate may increase 2 times.

The refresh row counter 50 of the concurrent refresh controller 42 may store row address information associated with a bank within the memory cell array 20. The refresh row counter 50 may store row address information for all subarrays within a bank of the memory cell array 20. For example, the refresh row counter 50 may store row address information associated with bank 0 of the memory cell array 20. In an exemplary embodiment, the row address information may include a refresh row address within subarrays of a bank within the memory cell array 20. During an operation, the refresh row counter 50 may be incremented or toggled to a next row address once all subarrays of a bank have been refreshed (e.g., as shown in further detail in FIG. 4).

The concurrent refresh subarray counter and latch 52 may store subarray address information associated with a bank within the memory cell array 20. For example, the concurrent refresh subarray counter and latch 52 may store the subarray address of a refresh operation. The concurrent refresh subarray counter and latch 52 may be incremented or toggled to a next subarray address (e.g., subarray address "1") upon the completion of a refresh operation to a first subarray address (e.g., subarray address "0").

Also, the concurrent refresh subarray counter and latch 52 may be set to a predetermined state. For example, the concurrent refresh subarray counter and latch 52 may be set to subarray address "0" during an initial set up. Also, the concurrent refresh subarray counter and latch 52 may be set to subarray address "10" during an initial set up. The concurrent refresh subarray counter and latch 52 may be reset or cleared after the concurrent refresh subarray counter and latch 52 increments or toggles through all subarrays in a bank of the memory cell array 20. In another exemplary embodiment, the concurrent refresh subarray counter and latch 52 may be reset or cleared after the concurrent refresh subarray counter and latch 52 increments or toggles through all subarrays in a bank of the memory cell array 20 a plurality of times. In other exemplary embodiments, the concurrent refresh subarray counter and latch 52 may not be reset or cleared and may continue to increment or toggle.

The clash buffer 54 may store one or more clash subarray addresses. In an exemplary embodiment, the concurrent refresh controller 42 may determine a clash condition based on a subarray address of an active command, a subarray address stored in the concurrent refresh subarray counter and latch 52, and/or a subarray address stored in the clash buffer 54. For example, a clash condition may occur in the event that the subarray address stored in the concurrent refresh subarray counter and latch 52 may be the same as the subarray address of an active command. When the subarray address stored in the concurrent refresh subarray counter and latch 52 is the same as the subarray address of the active command and if the clash buffer 54 is empty, the clash buffer 54 may be set to the subarray address in the concurrent refresh subarray counter and latch 52 because refresh operations to a subarray address may not be performed during an active command to that subarray address. Also, a clash condition may occur in the event that the subarray address stored in the clash buffer 54 is the same as the subarray address of an active command. In the concurrent refresh subarray counter and latch 52, in the event that the concurrent refresh subarray counter and latch 52 may not be reset or cleared, the concurrent refresh controller 42 may control a refresh operation to the subarray address stored in the concurrent refresh subarray counter and latch 52. Also, in the event that the concurrent refresh subarray counter and latch 52 may be reset or cleared, the concurrent refresh controller 42 may instruct the clash buffer 54 to provide the row address for a refresh operation in another refresh command.

Figure 4:
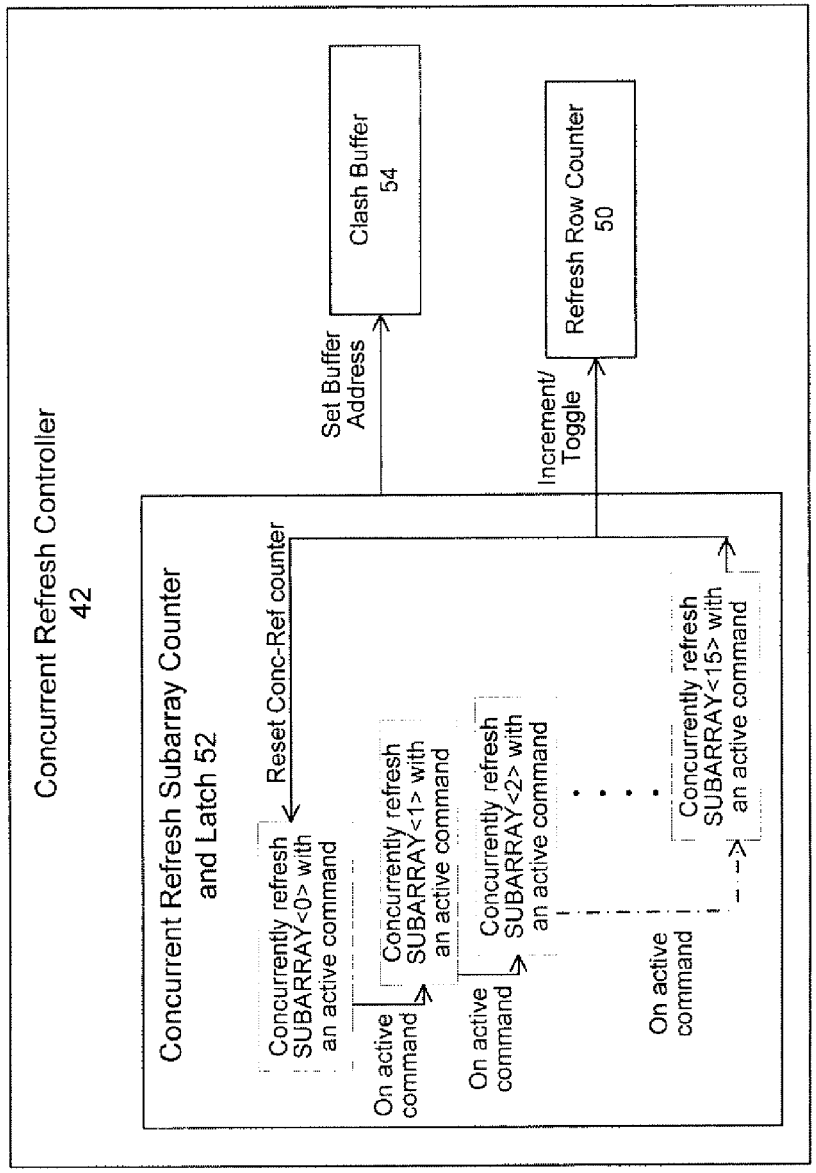
FIG. 4 shows a detailed block diagram of a concurrent refresh controller for a semiconductor memory device in accordance with an embodiment of the present disclosure.

Referring to FIG. 4, there is shown a detailed block diagram of a refresh row counter 50, a concurrent refresh subarray counter and latch 52, and a clash buffer 54 of a concurrent refresh controller 42 in accordance with an embodiment of the present disclosure. As discussed above, the refresh row counter 50 may increment or toggle to a next row address once the concurrent refresh subarray counter and latch 52 increments or toggles through all subarrays of a bank within the memory cell array 20. In an exemplary embodiment, the concurrent refresh controller 42 may be associated with bank 0. The refresh row counter 50 of the concurrent refresh controller 42 associated with bank 0 may be set to row zero. Also, the concurrent refresh subarray counter and latch 52 may be set to subarray address 0. As shown FIG. 4, the concurrent refresh subarray counter and latch 52 may increment or toggle to a next subarray address with each active command. The concurrent refresh subarray counter and latch 52 may continue to increment or toggle to a last subarray address (e.g., subarray address 15) of bank 0. Once the concurrent refresh subarray counter and latch 52 increments or toggles to the last subarray address of bank 0, the concurrent refresh subarray counter and latch 52 may be reset and cleared. Also, once the concurrent refresh subarray counter and latch 52 increments or toggles to the last subarray address of bank 0, the refresh row counter 50 may be incremented or toggled to a next row address (e.g., row address 1). In the event that the clash buffer 54 is not empty, the refresh row counter 50 may not increment to a next row address until the clash buffer 54 is emptied.

As described above, the concurrent refresh subarray counter and latch 52 may increment or toggle with every active command and the concurrent refresh subarray counter and latch 52 may sequentially increment or toggle to a next subarray address. For example, the concurrent refresh controller 42 associated with bank 0 may control a refresh operation to subarray 7 of bank 0. Also, an active command may control one or more operations to subarray 7 of bank 0 within the memory cell array 20. In the event that the active command and the concurrent refresh controller 42 may control one or more operations to the same subarray (e.g., subarray 7) of bank 0, the refresh operation may not be performed to the same subarray. Also, the clash buffer 54 may be set to the same subarray 7 and the concurrent refresh controller 42 may control refresh operation to a next subarray (e.g., subarray 8) of bank 0 within the memory cell array 20. The concurrent refresh controller 42 may control a refresh operation to a subarray address stored in the clash buffer 54 during a next active cycle.

In an exemplary embodiment, the concurrent refresh controller 42 associated with bank 0 within the memory cell array 20 may be operated independently from other concurrent refresh controllers 42 associated with other banks within the memory cell array 20. For example, the concurrent refresh controller 42 associated with bank 0 may control one or more refresh operations to bank 0 within the memory cell array 20, while the concurrent refresh controller 42 associated with bank 1 may remain inactive. Also, the concurrent refresh controller associated with bank 1 may control a refresh operation to subarray address 4 of bank 1, the concurrent refresh controller 42 associated with bank 7 may control a refresh operation to subarray address 15 of bank 7, and/or the concurrent refresh controller 42 associated with bank 3 may remain inactive. Also, the refresh row counter 50 of a concurrent refresh controller 42 may be independent from other refresh row counters 50 of other concurrent refresh controllers 42. For example, the refresh row counter 50 of each concurrent refresh controller 42 may maintain a row address for each bank within the memory cell array 20. In an exemplary embodiment, the row address maintained in the refresh row counter 50 of a concurrent refresh controller 42 may be based at least in part on one or more operations performed on each bank within the memory cell array 20.

Figure 5:
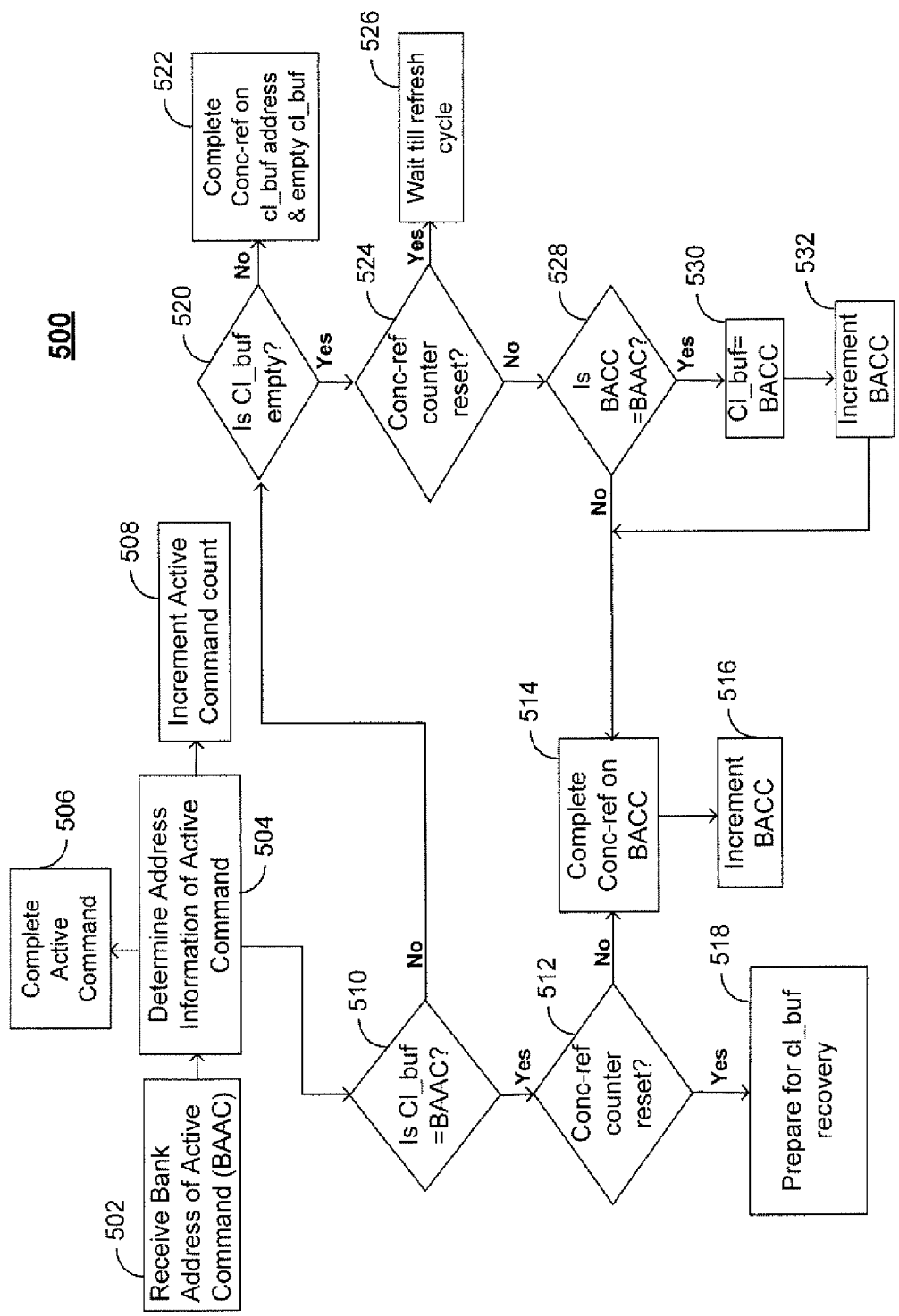
FIG. 5 shows a flow diagram for operation of a concurrent refresh controller for a semiconductor memory device in accordance with an embodiment of the present disclosure.

Referring to FIG. 5, there is shown a flow diagram of a method 500 of concurrently refreshing a semiconductor memory device in accordance with an embodiment of the present disclosure. This exemplary method 500 may be provided by way of example, as there are a variety of ways to carry out the method. The method 500 shown in FIG. 5 may be executed or otherwise performed by one or a combination of various semiconductor memory devices. The method 500 described below may be carried out by the semiconductor memory device 10 shown in FIGS. 1-4, by way of example, and various elements of the semiconductor memory device 10 are referenced in explaining the example method 500 of FIG. 5. Each block shown in FIG. 5 represents one or more processes, methods, or subroutines carried out in exemplary method 500. Referring to FIG. 5, exemplary method 500 may begin at block 502.

At block 502, one or more active commands (e.g., one or more bank activate, read operations, write operations, precharge operations, and/or refresh operations) may be received by a concurrent refresh controller 42 associated with a bank within the memory cell array 20. For example, one or more concurrent refresh controllers 42 associated with different banks within the memory cell array 20 may receive different active commands. Also, one or more concurrent refresh controllers 42 associated with one or more banks may receive one or more active commands, while the remaining concurrent refresh controllers 42 may remain inactive. In an exemplary embodiment, an active command may include bank row address information and/or bank subarray address information (BAAC) in order to properly and accurately control one or more operations to desired memory cells 12.

At block 504, the concurrent refresh controller 42 may determine the bank row address information and/or the bank subarray address information (BAAC) from the active command. Also, the concurrent refresh controller 42 may process the one or more active commands. The concurrent refresh controller 42 may control one or more operations to a bank within the memory cell array 20 based on the row address information and/or the subarray address information.

At block, 506, the concurrent refresh controller 42 may receive one or more active commands associated with a selected bank subarray address (BAAC). The performance of one or more operations may be controlled by the command decoder 44 and/or the concurrent refresh controller 42 or by control circuitry (not shown) outside of the concurrent refresh controller 42. In an exemplary embodiment, the concurrent refresh controller 42 may receive one or more active commands and the concurrent refresh controller 42 may perform one or more operations via a control circuitry (not shown) outside of the concurrent refresh controller 42. In another exemplary embodiment, the concurrent refresh controller 42 may provide one or more timing parameters (e.g., start time, end time, execute duration) for the concurrent refresh operations. In other exemplary embodiments, the concurrent refresh controller 42 may directly transfer the one or more commands to the row address latch and decoder 40 to perform one or more operations.

At block 508, the concurrent refresh controller 42 may increment or toggle a concurrent refresh subarray counter and latch 52 with every active command. As discussed in FIG. 4, the concurrent refresh controller 42 may increment or toggle a subarray address stored in the concurrent refresh subarray counter and latch 52 with each active command. Also, the concurrent refresh controller 42 may determine whether to reset or clear a concurrent refresh subarray counter and latch 52 based on a number of active commands received. For example, in the event that a number of active commands may be greater than or equal to a number of subarrays in a bank, the concurrent refresh controller 42 may reset or clear a concurrent refresh subarray counter and latch 52 because all of the subarrays in the bank may have been concurrently refreshed. In another exemplary embodiment, a concurrent refresh subarray counter and latch 52 and/or a clash buffer 54 may store a subarray address to be refreshed. In the event that a number of active commands may be greater than or equal to a number of subarrays in a bank, the subarray address stored in a concurrent refresh subarray counter and latch 52 and/or a clash buffer 54 may be refreshed during a next normal refresh command.

At block 510, the concurrent refresh controller 42 may initiate one or more algorithms to determine if a clash buffer has the same bank subarray address (BAAC) as one or more active commands. In the event that the bank subarray address (BAAC) of the one or more active commands is the same as the subarray address in the clash buffer 54, the concurrent refresh controller 42 may determine that a refresh operation may be blocked because a refresh operation and an active command may not be performed simultaneously on the same subarray of a bank. In the event that the clash buffer 54 does not have the same bank subarray address (BAAC) as the active command, a state of the clash buffer 54 may be determined.

At block 512, in the event that the subarray address stored in the clash buffer 54 is the same as the bank subarray address (BAAC) of the one or more active commands, the concurrent refresh controller 42 may determine whether the concurrent refresh subarray counter and latch 52 has been reset or cleared.

At block 514, in the event that the concurrent refresh subarray counter and latch 52 is not reset or cleared, the concurrent refresh controller 42 may control concurrent refresh operation on the bank subarray address (BACC) in the concurrent refresh subarray counter and latch 52 during the one or more active commands. The concurrent refresh operation controlled by the concurrent refresh controller 42 may satisfy the one or more active commands and/or the clash buffer 54 in the event that the active command and/or the concurrent refresh subarray counter and latch 52 may have the same subarray address. Subsequently, the concurrent refresh controller 42 may reset or clear the clash buffer 54.

At block 516, the concurrent refresh controller 42 may increment or toggle the bank subarray address (BACC) stored in the concurrent refresh subarray counter and latch 52.

At block 518, in the event that the concurrent refresh subarray counter and latch 52 was previously reset or cleared, the concurrent refresh controller 42 may maintain the subarray address stored in the clash buffer 54 for a refresh operation in a subsequent refresh command. The concurrent refresh controller may wait until a subsequent refresh command to control a refresh operation to the subarray address stored in the clash buffer 54.

At block 520, in the event that a clash buffer 54 does not have the same bank subarray address (BAAC) as one or more active commands (e.g., at block 510), the concurrent refresh controller 42 may determine whether a clash buffer 54 may be empty.

At block 522, in the event that the clash buffer 54 is not empty, the concurrent refresh controller 42 may control a refresh operation based on the subarray address information stored in the clash buffer 54. In an exemplary embodiment, the concurrent refresh controller 42 may control a refresh operation on an address stored in the clash buffer 54. Subsequently, the concurrent refresh controller 42 may also reset and/or empty the clash buffer 54 at block 522. The subarray address information stored in the clash buffer 54 may take priority over the subarray address information stored in the concurrent refresh subarray counter and latch 52 and the refresh operation may be performed first to the subarray address information stored in the clash buffer 54.

At block 524, in the event that the clash buffer 54 is empty, the concurrent refresh controller 42 may determine a status (e.g., reset or cleared) of the concurrent refresh subarray counter and latch 52.

At block 526, in the event that the concurrent refresh subarray counter and latch 52 is reset or cleared, the concurrent refresh subarray counter and latch 52 may not be used to perform refresh operations until a next refresh command. For example, the concurrent refresh subarray counter and latch 52 may be reset or cleared when the concurrent refresh subarray counter and latch 52 has been used to refresh all of the subarrays of a bank within the memory cell array 20. Therefore, the concurrent refresh subarray counter and latch 52 may not be used to perform refresh operations to the subarrays of the bank within the memory cell array 20 until a next refresh cycle.

At block 528, in the event that the concurrent refresh subarray counter and latch 52 may not be reset or cleared, the concurrent refresh controller 42 may determine whether the bank subarray address (BACC) stored in the concurrent refresh subarray counter and latch 52 may be the same as the bank subarray address (BAAC) of the one or more active commands. In the event that the bank subarray address (BACC) stored in the concurrent refresh subarray counter and latch 52 is not the same as the bank subarray address (BAAC) of the one or more active commands, the concurrent refresh controller 42 may control a refresh operation to the bank subarray address (BACC) stored in the concurrent refresh subarray counter and latch 52, as indicated at block 514.

At block 530, in the event that the bank subarray address (BACC) stored in the concurrent refresh subarray counter and latch 52 is the same as the bank subarray address (BAAC) of the one or more active commands, the concurrent refresh controller 42 may set the clash buffer 54 to have the same bank subarray address (BACC) as stored in the concurrent refresh subarray counter and latch 52. For example, the one or more active commands and the concurrent refresh subarray counter and latch 52 may have the same bank subarray address, and the one or more active commands will be executed on the bank subarray address before the refresh operation controlled by the concurrent refresh controller 42. The refresh operation may be performed on the subarray address stored in the clash buffer 54 at a next refresh command.

At block 532, because the bank subarray address (BAAC) of the one or more active commands is the same as the bank subarray address (BACC) stored in the concurrent refresh subarray counter and latch 52, the bank subarray address (BACC) stored in the concurrent refresh subarray counter and latch 52 may be incremented or toggled to an address of a next subarray of the bank within the memory cell array 20. The concurrent refresh controller 42 may control the refresh operation on the next subarray of the bank within the memory cell array 20, as indicated at block 514. Subsequently, the bank subarray address (BACC) stored in the concurrent refresh subarray counter and latch 52 may be incremented or toggled to a next subarray address, as indicated at block 516.

At this point it should be noted that reducing impact of array disturbs in a semiconductor memory device in accordance with the present disclosure as described above typically involves the processing of input data and the generation of output data to some extent. This input data processing and output data generation may be implemented in hardware or software. For example, specific electronic components may be employed in a semiconductor memory device or similar or related circuitry for implementing the functions associated with reducing impact of array disturbs in a semiconductor memory device in accordance with the present disclosure as described above. Alternatively, one or more processors operating in accordance with instructions may implement the functions associated with reducing impact of array disturbs in a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for reducing impact of array disturbs in a semiconductor memory device, the method comprising:
receiving a first refresh command including a first subarray address to perform a first refresh operation to a first logical subarray of memory cells associated with the first subarray address;
receiving a second refresh command including a second subarray address to perform a second refresh operation to a second logical subarray of memory cells associated with the second subarray address, wherein the second refresh command is received after a time period from the reception of the first refresh command; and
performing a number of concurrent refresh operations during the time period;
wherein in the event that the active subarray address of the active operation is equal to a refresh subarray address of a first concurrent refresh operation, the refresh subarray address is stored in a clash buffer.

2. The method according to claim 1, wherein the number of concurrent refresh operations is based at least in part on a number of active operations including an active subarray address performed during the time period, wherein the active operations access one or more subarray addresses.

3. The method according to claim 1, wherein the number of concurrent refresh operations performed is based at least in part on a number of plurality of subarrays within a plurality of banks of memory cells.

4. The method according to claim 1, wherein the refresh subarray address stored in the clash buffer is used for a second concurrent refresh operation, wherein the first concurrent refresh operation is performed to a different subarray address than the second concurrent refresh operation.

5. The method according to claim 4, further comprises clearing the clash buffer when the second concurrent refresh operation is performed to the refresh subarray address stored in the clash buffer.

6. The method according to claim 1, further comprises clearing the clash buffer upon completion of at least one of the first refresh operation and the second refresh operation to a subarray address stored in the clash buffer.

7. The method according to claim 1, the refresh subarray address stored in the clash buffer is used for the second subarray address for the second refresh operation.

8. The method according to claim 1, wherein the concurrent refresh operations are performed to a subarray address stored in a concurrent refresh subarray counter and latch.

9. A method for increasing a refresh rate for a semiconductor memory device receiving one or more refresh commands, the method comprising:
receiving a first refresh command including a first subarray address to perform a first refresh operation to a first logical subarray of memory cells associated with the first subarray address;
receiving a second refresh command including a second subarray address to perform a second refresh operation to a second logical subarray of memory cells associated with the second subarray address, wherein the second refresh command is received after a time period from the reception of the first refresh command; and
performing a number of concurrent refresh operations during the time period;
wherein in the event that the active subarray address of the active operation is equal to a refresh subarray address of a first concurrent refresh operation, the refresh subarray address is stored in a clash buffer.

10. The method according to claim 9, wherein the number of concurrent refresh operations is based at least in part on a number of active operations including an active subarray address performed during the time period, wherein the active operations access one or more subarray addresses.

11. The method according to claim 9, wherein the number of concurrent refresh operations performed is based at least in part on a number of plurality of subarrays within a plurality of banks of memory cells.

12. The method according to claim 9, wherein the refresh subarray address stored in the clash buffer is used for a second concurrent refresh operation, wherein the first concurrent refresh operation is performed to a different subarray address than the second concurrent refresh operation.

13. The method according to claim 12, further comprises clearing the clash buffer when the second concurrent refresh operation is performed to the refresh subarray address stored in the clash buffer.

14. The method according to claim 9, further comprises clearing the clash buffer upon completion of at least one of the first refresh operation and the second refresh operation.

15. The method according to claim 9, the refresh subarray address stored in the clash buffer is used for the second subarray address for the second refresh operation.

16. The method according to claim 9, wherein the concurrent refresh operations are performed to a subarray address stored in a concurrent refresh subarray counter and latch.

17. A system for reducing impact of array disturbs in a semiconductor memory device comprising:
   means for receiving a first active command directed to an active subarray address to perform a number of active operations to the active subarray address; and
   means for performing a number of concurrent refresh operations between two consecutive refresh operations to one or more inactive subarray addresses, wherein the number of concurrent refresh operations is based at least in part on the number of active operations performed between the two consecutive refresh operations;
   wherein in the event that the active subarray address of the active operations is equal to an inactive subarray address of a concurrent refresh operation, the inactive subarray address is stored in a clash buffer.

18. A semiconductor memory device comprising:
   a memory cell array having one or more banks of memory cells arranged in arrays of rows and columns, wherein each of the one or more banks of memory cells includes a plurality of subarrays of memory cells;
   a plurality of concurrent refresh controllers coupled to the one or more banks of memory cells configured to provide one or more concurrent refresh control signals to the one or more banks of memory cells in order to perform one or more concurrent refresh operations; and
   a normal refresh controller coupled to the plurality of concurrent refresh controllers.

19. The semiconductor memory device according to claim 18, further comprising one or more row address latch and decoders configured to provide the one or more concurrent refresh control signals from the plurality of concurrent refresh controllers to the one or more banks of memory cells.

20. The semiconductor memory device according to claim 19, wherein each of the plurality of concurrent refresh controllers is configured to generate a multiplexer control signal that enables or disables a corresponding row address latch and decoder.

21. The semiconductor memory device according to claim 18, wherein each of the plurality of concurrent refresh controllers comprises a refresh row counter.

22. The semiconductor memory device according to claim 21, wherein the refresh row counter stores row address information associated with the plurality of subarrays of a corresponding one of the one or more banks of memory cells.

23. The semiconductor memory device according to claim 21, wherein each of the plurality of concurrent refresh controllers further comprises a concurrent refresh subarray counter and latch.

24. The semiconductor memory device according to claim 23, wherein the concurrent refresh subarray counter and latch stores subarray address information associated with a corresponding one of the one or more banks of memory cells.

25. The semiconductor memory device according to claim 23, wherein each concurrent refresh subarray counter and latch increments or toggles to a next subarray address with each execution of an active command.

26. The semiconductor memory device according to claim 23, wherein, after each concurrent refresh subarray counter and latch increments or toggles through all of the plurality of subarrays of a corresponding one of the one or more banks of memory cells, a corresponding refresh row counter increments or toggles to a next row address.

27. The semiconductor memory device according to claim 23, wherein each of the plurality of concurrent refresh controllers further comprises a clash buffer.

28. The semiconductor memory device according to claim 27, wherein the clash buffer stores subarray address information in the event of a clash condition.

29. The semiconductor memory device according to claim 28, wherein the clash condition occurs in the event that subarray address information of one or more active commands equals subarray address information stored in a corresponding concurrent refresh subarray counter and latch or the subarray address information of the one or more active commands equals subarray address information stored in a corresponding clash buffer.

30. The semiconductor memory device according to claim 28, wherein, in the event of the clash condition, a clash buffer is set to a subarray address stored in a corresponding concurrent refresh subarray counter and latch.

31. The semiconductor memory device according to claim 18, further comprising a command decoder.

32. The semiconductor memory device according to claim 31, wherein the command decoder is configured to provide one or more active commands to the one or more banks of memory cells in order to perform one or more operations.

33. The semiconductor memory device according to claim 32, wherein the one or more operations include at least one of a read operation, a write operation, a precharge operation, and a refresh command.

34. The semiconductor memory device according to claim 18, wherein the normal refresh controller is configured to provide one or more refresh control signals to the plurality of concurrent refresh controllers.

* * * * *